United States Patent
Chen et al.

(10) Patent No.: US 11,649,714 B1
(45) Date of Patent: May 16, 2023

(54) METHOD FOR PREDICTING AND OPTIMIZING RATE OF PENETRATION (ROP) FOR OIL AND GAS DRILLING BASED ON BAYESIAN OPTIMIZATION

(71) Applicant: Southwest Petroleum University, Chengdu (CN)

(72) Inventors: Yan Chen, Chengdu (CN); Yuchuan An, Chengdu (CN); Xiangchao Shi, Chengdu (CN); Yu Yi, Chengdu (CN); Yang Wang, Chengdu (CN); Zhicheng Li, Chengdu (CN); Gaocheng Feng, Chengdu (CN); Yangbing Li, Chengdu (CN); Ping Li, Chengdu (CN); Yuan Zhong, Chengdu (CN); Ming Xian, Chengdu (CN); Hu Deng, Chengdu (CN); Yuming Wang, Chengdu (CN); Yuehao Liu, Chengdu (CN)

(73) Assignee: Southwest Petroleum University, Chengdu (CN)

( * ) Notice: Subject to any disclaimer, the term of this patent is extended or adjusted under 35 U.S.C. 154(b) by 0 days.

(21) Appl. No.: 17/714,164

(22) Filed: Apr. 6, 2022

(30) Foreign Application Priority Data

Oct. 22, 2021 (CN) .......................... 202111230016.8

(51) Int. Cl.
E21B 45/00 (2006.01)
G06F 30/27 (2020.01)

(52) U.S. Cl.
CPC .............. *E21B 45/00* (2013.01); *G06F 30/27* (2020.01)

(58) Field of Classification Search
CPC ........... E21B 45/00; G06F 30/27; G06F 30/20
See application file for complete search history.

(56) References Cited

U.S. PATENT DOCUMENTS

2021/0058235 A1* 2/2021 Rangarajan .......... H04L 9/3239

FOREIGN PATENT DOCUMENTS

| CN | 110807234 A | 2/2020 |
| CN | 111520122 A | 8/2020 |

(Continued)

OTHER PUBLICATIONS

Farqad Hadi et al., "Modeling Rate of Penetration using Artificial Intelligent System and MultipleRegression Analysis," SPE-197663-MS p. 1-10 (Year: 2019).*

(Continued)

*Primary Examiner* — Steven W Crabb
(74) *Attorney, Agent, or Firm* — Bayramoglu Law Offices LLC

(57) ABSTRACT

A method for predicting and optimizing an ROP for oil and gas drilling based on Bayesian optimization includes: acquiring raw drilling data according to a preset sampling period, constructing an initial sample data set based on the raw drilling data, constructing an ROP prediction model based on the initial sample data set, and predicting an ROP at a next sample point through a Gaussian process regression based on the ROP prediction model. The present invention realizes rapid analysis of historical drilling data and accurate prediction of an ROP range at a sample point in a feasible domain. The method can obtain an optimized ROP and an optimized engineering parameter through Bayesian optimization, and obtain an engineering parameter corresponding to an optimal ROP. The method has few restrictions on the drilling engineering parameter and the raw formation parameter, improves prediction accuracy, and avoids the problem of blurred parameter value boundaries.

5 Claims, 3 Drawing Sheets

(56) References Cited

FOREIGN PATENT DOCUMENTS

| | | | |
|---|---|---|---|
| CN | 113343558 A | 9/2021 | |
| CN | 113378344 A | 9/2021 | |
| CN | 113378998 A | 9/2021 | |
| WO | WO-2019216891 A1 * | 11/2019 | ............. E21B 21/08 |

OTHER PUBLICATIONS

Jeremy Eade, "Using Data Analytics to Improve Drilling Rate of Penetration," SPE-201764-MS, p. 1-14 (Year: 2020).*
Cui Jia-Xu, et al., Survey on Bayesian Optimization Methodology and Applications, Journal of Software, 2018, pp. 3068-3090, vol. 29, No. 10.
Mohammad Anemangely, et al., Drilling rate prediction from petrophysical logs and mud logging data using an optimized multilayer perceptron neural network, Journal of Geophysics and Engineering, 2018, pp. 1146-1159, vol. 15.

* cited by examiner

METHOD FOR PREDICTING AND OPTIMIZING RATE OF PENETRATION (ROP) FOR OIL AND GAS DRILLING BASED ON BAYESIAN OPTIMIZATION

CROSS REFERENCE TO THE RELATED APPLICATIONS

This application is based upon and claims priority to Chinese Patent Application No. 202111230016.8, filed on Oct. 22, 2021, the entire contents of which are incorporated herein by reference.

TECHNICAL FIELD

The present invention relates to the field of petroleum exploration and drilling engineering, and more particularly, to a method for predicting and optimizing a rate of penetration (ROP) for oil and gas drilling based on a Bayesian optimization algorithm (BOA).

BACKGROUND

In recent years, to achieve coordinated, stable and sustainable development of oil and gas resources, China has intensified the exploration and development of oil and gas resources, and the focus of oil and gas exploration and development in each oilfield has gradually shifted to deep formations. The drilling and production process of deep wells and ultra-deep wells involves multiple strata. These strata span multiple geological times, change greatly and have complex geological conditions, which poses great challenges to engineering construction. On the other hand, engineering construction pursues short drilling cycles, low drilling costs and high drilling efficiency. Therefore, it is of great significance to study the influence of various drilling parameters on the ROP under certain geological conditions and to improve the ROP by configuring various drilling parameters.

In 1965, some scholars first proposed the specific bulk work of fracture (SBWF) to define the energy consumed by breaking a unit volume of rock, and established a mathematical model between the drilling parameters such as thrust force, advance rate, torque and rotation speed and formation characteristics. Afterwards, to optimize multiple drilling parameters, an American company researched and developed a hydraulic drillability chart involving the minimum hydraulic horsepower of the bit and the maximum economic hydraulic horsepower. On this basis, the weight on bit (WOB) and the ROP were optimized, and a relationship between the optimal hydraulic parameter and the optimal mechanical parameter was established. Some scholars took the mechanical specific energy (MSE) as the goal to realize the real-time evaluation of the drilling efficiency of the bit, and analyzed the bit balling type to improve the operation of the bit while completing the optimization of the WOB and ROP. Later, some scholars established a dynamic system composed of a flow-well model, a drill pipe mechanics model, a thermophysical model, a solid transport model, a torque model and a fishing model, and the system can be used to calculate drilling parameters and detect well conditions. With the development of artificial intelligence (AI) technology, the use of machine learning (ML) to predict ROP has become the focus of the industry. Some scholars have compared the prediction accuracy of a neural network with that of a conventional model, and found that the neural network has higher prediction accuracy under the same parameters, reaching 98.5%.

Chinese Patent CN110807557A proposes an ROP prediction method based on a back-propagation (BP) neural network, which combines a particle swarm optimization (PSO) algorithm to optimize drilling parameters such as torque, WOB, pump pressure and displacement. This method includes two parts. First, the BP neural network is combined with historical drilling data to train a BP neural network model to predict an ROP. Then, based on the ROP predicted by the trained neural network, the drilling parameters are iteratively optimized by the PSO algorithm so as to obtain a drilling parameter combination to achieve the optimal ROP.

Chinese Patent CN112487582A proposes a method for predicting and optimizing an ROP for oil and gas drilling based on a classification and regression tree (CART). This method establishes the CART with a depth being less than or equal to 6 based on historical drilling data to predict the ROP and optimize a drilling parameter. During prediction, the mean of each leaf node of the CART is used as a predicted ROP, and non-leaf nodes indicate recommended values of the drilling parameter.

However, in the prior art, the mathematical explanation involved in the optimization of ROP for oil and gas drilling is not clear. In addition, the drilling engineering parameter cannot be dynamically optimized based on the formation parameter, thereby failing to obtain a drilling engineering parameter combination under a certain formation parameter to maximize the ROP.

SUMMARY

In view of the shortcomings existing in the prior art, the present invention provides a method for predicting and optimizing an ROP for oil and gas drilling based on a BOA. The present invention solves the problem that in the prior art, the mathematical explanation involved in the optimization of ROP for oil and gas drilling is not clear, and the drilling engineering parameter cannot be dynamically optimized based on the formation parameter.

In order to achieve the above objective, the present invention adopts the following technical solution:

A first aspect of the present invention provides a method for predicting an ROP for oil and gas drilling based on Bayesian optimization, which includes the following steps:

S1: acquiring raw drilling data according to a preset sampling period;

S2: constructing an initial sample data set based on the raw drilling data acquired in step S1;

S3: constructing an ROP prediction model based on the initial sample data set constructed in step S2; and S4: predicting an ROP at a next sample point through a Gaussian process regression based on the ROP prediction model constructed in step S3.

The present invention has the following beneficial effects:

The present invention acquires raw drilling data according to a preset sampling period, constructs an initial sample data set based on the raw drilling data, constructs an ROP prediction model based on the initial sample data set constructed, and predicts an ROP at a next sample point through a Gaussian process regression based on the ROP prediction model. The present invention provides a clear mathematical explanation, and realizes rapid analysis of historical drilling data and accurate prediction of an ROP range at any point in a feasible domain.

Further, step S2 may include:

constructing spatial sequence data being spatially continuous based on well depth data included in the raw drilling data acquired in step S1, and obtaining the initial sample data set by taking an engineering parameter included in the raw drilling data and a raw formation parameter as sample features and taking an ROP included in the raw drilling data as a data label.

This further solution has the following beneficial effects:

The acquired raw drilling data is preprocessed to obtain an initial sample data set, which simplifies the redundancy between data and improves the data accuracy for subsequent data prediction and optimization.

Further, step S3 may include:

S31: calculating a mean vector of each sample point based on the initial sample data set constructed in step S2;

S32: constructing a covariance matrix of each sample point through a Gaussian kernel function based on the initial sample data set constructed in step S2:

$$\sum(x_{1:n}, x_{1:n}) = \begin{pmatrix} cov(x_1, x_1) & \cdots & cov(x_1, x_n) \\ \vdots & \Box & \vdots \\ cov(x_n, x_1) & \cdots & cov(x_n, x_n) \end{pmatrix} = \begin{pmatrix} k(x_1, x_1) & \cdots & k(x_1, x_n) \\ \vdots & \Box & \vdots \\ k(x_n, x_1) & \cdots & k(x_n, x_n) \end{pmatrix}$$

where, $\Sigma(x_{1:n}, x_1:n)$ denotes the covariance matrix of each sample point in the initial sample data set; $k(x_n, x_1)$ denotes a Gaussian kernel function of a sample point pair $(x_n, x_1)$ in the initial sample data set; and $cov(x_n, x_1)$ denotes a covariance of the sample point pair $(x_n, x_1)$ in the initial sample data set; and S33: constructing an ROP function through a Gaussian function based on the mean vector calculated in step S31 and the covariance matrix constructed in step S32, and obtaining the ROP prediction model.

This further solution has the following beneficial effects:

The ROP function is constructed through the Gaussian function to obtain the ROP prediction model, which realizes the rapid analysis of historical drilling data and prediction of the ROP range at any point in the feasible domain. This method has few restrictions on the drilling engineering parameter and raw formation parameter, and has high prediction accuracy.

Further, the Gaussian kernel function in step S32 may be expressed as:

$$k(x_1, x_2) = \alpha_0 \exp\left(-\frac{1}{2\sigma^2} \|x_1 - x_2\|^2\right)$$

where, $k(x_1, x_2)$ denotes a Gaussian kernel function of a sample point pair $(x_1, x_2)$ in the initial sample data set; $\alpha_0$ and $\sigma$ are kernel function parameters; and $\|\cdot\|^2$ are 2-norms.

This further solution has the following beneficial effects:

The expression of the Gaussian kernel function transforms the features of the initial sample data set from low-dimensional to high-dimensional. It realizes the calculation of high-dimensional dot product in low-dimensional space, avoids the complex calculation directly in high-dimensional space, and improves the prediction speed of the ROP.

Further, the ROP function constructed in step S33 may be expressed as:

$$f(x_{1:n}) \sim gp(\mu(x_{1:n}), \Sigma(x_{1:n}, x_{1:n}))$$

where, $f(x_{1:n})$ denotes an ROP function in a continuous domain; $\mu(x_{1:n})$ denotes the mean vector of each sample point in the initial sample data set; $\Sigma(x_{1:n}, x_{1:n})$ denotes the covariance matrix of each sample point in the initial sample data set; gp(·) denotes the Gaussian function; and ~ denotes mapping.

This further solution has the following beneficial effects:

Based on the ROP prediction model constructed through the Gaussian process regression, the correlation between the features of the sample data is reflected by the covariance matrix, and the rapid analysis of the historical drilling data is realized.

A second aspect of the present invention further provides a method for optimizing an ROP, which is based on the method for predicting an ROP for oil and gas drilling based on Bayesian optimization, and includes the following steps:

S5: constructing an ROP optimization model based on the ROP prediction model and a prediction result in step S4; and S6: obtaining an optimized ROP based on the ROP optimization model constructed in step S5.

The present invention has the following advantages:

The optimization method constructs the ROP optimization model based on the prediction result obtained by the ROP prediction model constructed by the prediction method. The optimization method provides a clear mathematical explanation. It can rapidly analyze the historical drilling data, calculate the ROP fluctuation range of the next sample point in the feasible domain through the Bayesian optimization, and obtain the optimized ROP based on the ROP optimization model. The optimization method has few restrictions on the drilling engineering parameter and the raw formation parameter, improves prediction accuracy, avoids the problem of blurred parameter value boundaries, and realizes clear and accurate optimization.

Further, step S5 may include:

constructing a sample point set based on the prediction result obtained by the ROP prediction model in step S4 and the initial sample data set constructed in step S1; and constructing a sampling function by selecting a maximum value of the ROP function of each sample point that is calculated by the ROP prediction model, and obtaining the ROP optimization model.

This further solution has the following beneficial effects:

The ROP optimization model is constructed by the Gaussian function, which can dynamically optimize the drilling engineering parameter based on the formation parameter, and obtain a combination of drilling engineering parameters under certain formation parameters, so as to obtain the optimized ROP.

Further, the sampling function in step S5 may be expressed as:

$$u_{EI}(x) = (\mu(x) - f_n^*) - (\mu(x) - f_n^*)\Phi\left(\frac{\mu(x) - f_n^*}{\sigma(x)}\right) + \sigma(x)\varphi\left(\frac{\mu(x) - f_n^*}{\sigma(x)}\right)$$

where, $u_{EI}(x)$ denotes the sampling function; $\mu(x)$ denotes a mean of the sampling function at searched n sample points; $\sigma(x)$ denotes a variance of the sampling function at the searched n sample points; $f_n^*$ denotes a maximum value of the sampling function at the searched n sample points; $\varphi(\cdot)$ denotes a probability) density function of a standard normal distribution (SND); and $\Phi(\cdot)$ denotes a distribution function of the SND.

This further solution has the following beneficial effects:

The sampling function is constructed to filter the next sample point, and the sampling times are significantly reduced by means of the mean and variance, so as to realize the rapid analysis of historical drilling data, and obtain the ROP range of the sample points in the feasible domain.

Further, step S6 may include:

S61: obtaining an ROP fluctuation range of the next sample point through Bayesian method based on the ROP of the next sample point obtained by the ROP prediction model and a mean and a variance of each feature parameter in the sampling period;

S62: obtaining a corresponding ROP by using a raw geological parameter and a raw well depth of each sample point in the sample point set in step S5 as fixed parameters and randomly changing the engineering parameter;

S63: retaining an ROP within the ROP fluctuation range and a corresponding engineering parameter, and updating the retained ROP and the corresponding engineering parameter to the sample point set;

S64: obtaining a value of the sampling function of a current sample point set;

S65: determining whether a number of obtaining the value of the sampling function in step S64 reaches a preset threshold; and if yes, proceeding to step S66, otherwise returning to step S61 based on the current sample point set; and S66: taking an updated ROP corresponding to the maximum value of the sampling function as the optimized ROP, and taking an updated engineering parameter corresponding to the maximum value of the sampling function as an optimized engineering parameter.

This further solution has the following beneficial effects:

The constructed ROP optimization model is combined with the data in the acquired data set to dynamically optimize the drilling engineering parameter based on the formation parameter, and obtain a combination of drilling engineering parameters under certain formation parameters. The ROP is optimized, and the optimal engineering parameter is obtained. This method avoids the problem of blurred parameter value boundaries, and realizes clear and accurate optimization.

DETAILED DESCRIPTION OF THE EMBODIMENTS

The specific implementations of the present invention are described below to facilitate those skilled in the art to understand the present invention, but it should be clear that the present invention is not limited to the scope of the specific implementations. Various obvious changes made by those of ordinary skill in the art within the spirit and scope of the present invention defined by the appended claims should fall within the protection scope of the present invention.

Figure 1:
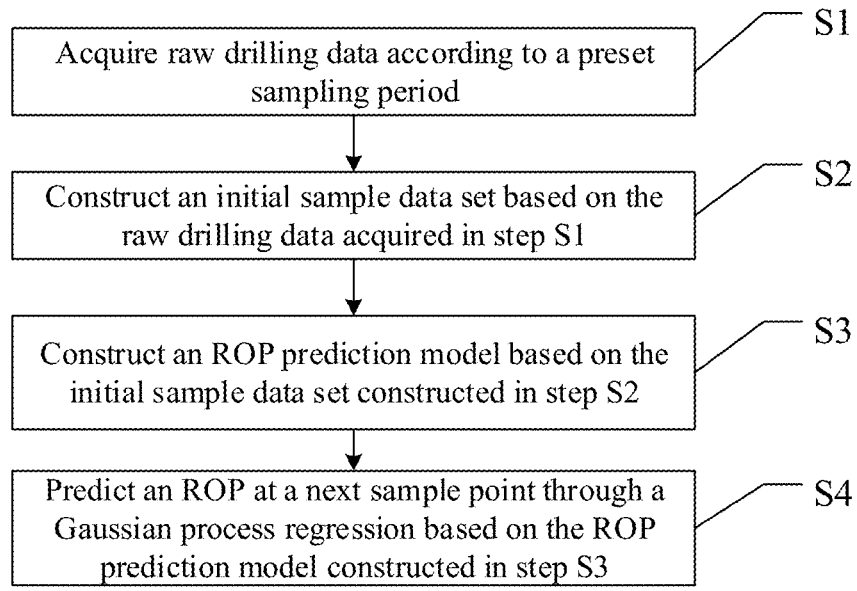
FIG. 1 is a flowchart of a method for predicting an ROP for oil and gas drilling based on Bayesian optimization according to the present invention.

As shown in FIG. 1, an embodiment of the present invention provides a method for predicting an ROP for oil and gas drilling based on Bayesian optimization, which includes the following sub steps:

S1: Acquire raw drilling data according to a preset sampling period.

In a practical application, all oil wells in an oilfield area are sampled in a sampling period defined by an interval of five meters. An engineering parameter of a drilling tool is measured by using a sensor, and a formation parameter at a time of measurement is recorded. The drilling engineering parameter and the raw formation parameter had a total of K dimensions.

S2: Construct an initial sample data set based on the raw drilling data acquired in step S1.

In this embodiment, Step S2 includes:

Construct spatial sequence data being spatially continuous based on well depth data included in the raw drilling data acquired in step S1, and obtain the initial sample data set by taking an engineering parameter included in the raw drilling data and a raw formation parameter as sample features and taking an ROP included in the raw drilling data as a data label.

In a practical application, all oil wells in an oilfield area are sampled in a sampling period defined by an interval of five meters. An engineering parameter of a drilling tool is measured by using a sensor, and raw drilling data $X=\{x_n\}_1^N$ is acquired, N being a dimension of a sample feature, that is, a number of sample features. The drilling engineering parameter and the raw formation parameter in the drilling data are taken as the sample features $L=\{L_k\}_1^K$, K being the dimension of the sample features in the drilling data and the raw formation data. The ROP is taken as a data label $Y=\{y_n\}_1^N$, and the parameters are divided into the drilling engineering parameter, the raw formation parameter and a sequence parameter. The drilling engineering parameter affecting the ROP includes WOB, rotation speed, torque, drilling fluid density, flow rate, etc. The raw formation parameter affecting the ROP includes natural gamma ray GR, acoustic travel time difference AC, etc. The sequence parameter includes well depth. All drilling data included in the drilling engineering parameter, the raw formation parameter and the sequence parameter are input. With the ROP label, an initial sample data set D is constructed, as shown in Table 1.

TABLE 1

Data sample parameters in the initial sample data set

| Type of input parameter | Feature name |
| --- | --- |
| Drilling engineering parameter | WOB |
|  | Rotation speed |
|  | Torque |
|  | Drilling fluid density |
|  | Displacement |
|  | Riser pressure |
|  | Drilling tool |
|  | . . . |
| Raw formation parameter | Natural gamma ray GR |
|  | Acoustic travel time difference AC |
|  | Lithology |
|  | . . . |
| Sequence parameter | Well depth |

S3: Construct an ROP prediction model based on the initial sample data set constructed in step S2.

Figure 2:
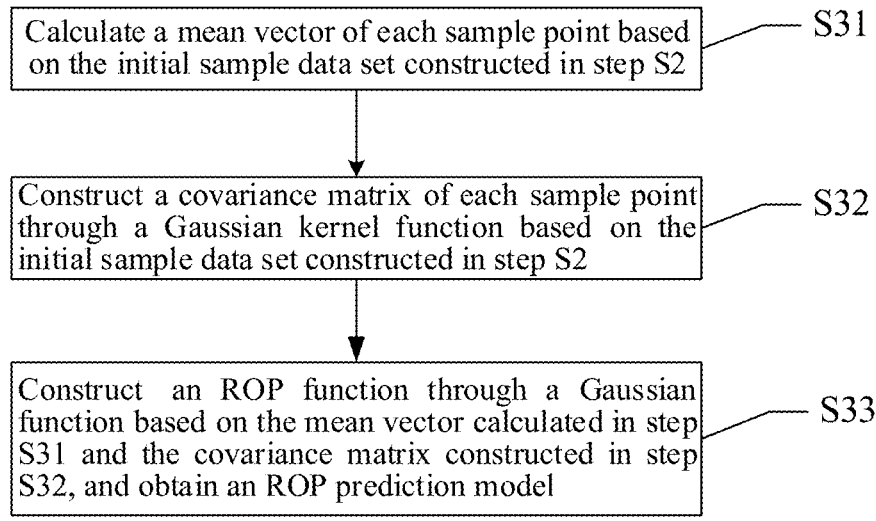
FIG. 2 is a flowchart of step S3 of the prediction method according to the present invention.

As shown in FIG. 2, Step S3 includes:

S31: Calculating a mean vector of each sample point based on the initial sample data set constructed in step S2.

In a practical application, a mean function μ(x) is used to calculate a mean vector of each sample point x in the initial sample data set, that is, $\mu(x_{1:n})=(\mu(x_1) \ldots \mu(x_n))^T$, where the mean vector of each sample point is expressed as: $\mu(x_{1:n})$, $(\ )^T$ denoting a transposition.

S32: Construct a covariance matrix of each sample point through a Gaussian kernel function based on the initial sample data set constructed in step S2:

$$\sum(x_{1:n}, x_{1:n}) = \begin{pmatrix} cov(x_1, x_1) & \cdots & cov(x_1, x_n) \\ \vdots & \ddots & \vdots \\ cov(x_n, x_1) & \cdots & cov(x_n, x_n) \end{pmatrix} = \begin{pmatrix} k(x_1, x_1) & \cdots & k(x_1, x_n) \\ \vdots & \ddots & \vdots \\ k(x_n, x_1) & \cdots & k(x_n, x_n) \end{pmatrix}$$

where, $\Sigma(x_{1:n}, x_{1:n})$ denotes the covariance matrix of each sample point in the initial sample data set; $k(x_n, x_1)$ denotes a Gaussian kernel function of a sample point pair $(x_n, x_1)$ in the initial sample data set; and $cov(x_n, x_1)$ denotes a covariance of the sample point pair $(x_n, x_1)$ in the initial sample data set.

In this embodiment, the Gaussian kernel function in step S32 is expressed as:

$$k(x_1, x_2) = \alpha_0 \exp\left(-\frac{1}{2\sigma^2}\|x_1 - x_2\|^2\right)$$

where, $k(x_1, x_2)$ denotes a Gaussian kernel function of a sample point pair $(x_1, x_2)$ in the initial sample data set; $\alpha_0$ and $\sigma$ are kernel function parameters; and are $\|\cdot\|^2$ are 2-norms.

In the present invention, the parameters and $\alpha_0$ and $\sigma$ of the kernel function both may take a value of 1.

S33: Construct an ROP function through a Gaussian function based on the mean vector calculated in step S31 and the covariance matrix constructed in step S32, and obtain the ROP prediction model.

In this embodiment, the ROP function constructed in step S33 is expressed as:

$$f(x_{1:n}) \sim gp(\mu(x_{1:n}), \Sigma(x_{1:n}, x_{1:n}))$$

where, $f(x_{1:n})$ denotes an ROP function in a continuous domain, which defines the ROP prediction model; $\mu(x_{1:n})$ denotes the mean vector of each sample point in the initial sample data set, which is a vector composed of the mean of each feature parameter in each sampling period; $\Sigma(x_{1:n}, x_{1:n})$ denotes the covariance matrix of each sample point in the initial sample data set, which is a matrix composed of the covariance of each feature parameter in each sampling period; $gp(\cdot)$ denotes the Gaussian function; and ~ denotes mapping.

S4: Predict an ROP at a next sample point through a Gaussian process regression based on the ROP prediction model constructed in step S3.

In a practical application, the corresponding function value $f(x_{1:n})$ of the known sampling group $x_{1:n}$ in the initial sample data set is calculated by the ROP function in the ROP prediction model. According to the corresponding function value $f(x_{1:n})$ of the known sampling group $x_{1:n}$ in the initial sample data set, a Gaussian process regression is performed through the ROP prediction model to predict a new set of sample values $x_{n+1}$ of the drilling parameter and corresponding ROP values. In other words, a posterior probability distribution $p(f(x_{n+1})|x_{n+1}, D)$ is calculated. According to the properties of the Gaussian distribution, both the marginal distribution and the conditional distribution of the Gaussian distribution are Gaussian distributions. Therefore, the posterior probability distribution satisfies a multivariate Gaussian distribution, thereby obtaining the ROP at the next sample point.

Figure 3:
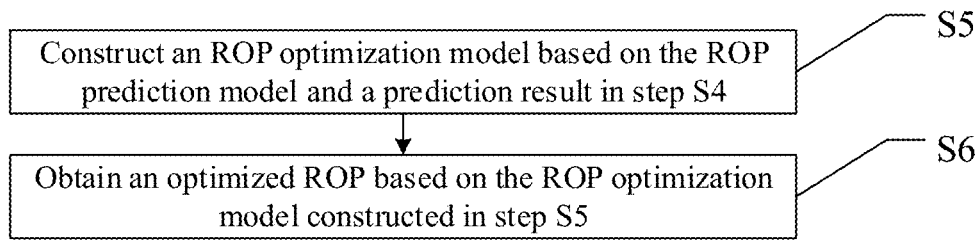
FIG. 3 is a flowchart of a method for optimizing an ROP for oil and gas drilling based on Bayesian optimization according to the present invention.

As shown in FIG. 3, the present invention further provides a method for optimizing an ROP, which is based on the method for predicting an ROP for oil and gas drilling based on Bayesian optimization, and includes steps S5 and S6:

S5: Construct an ROP optimization model based on the ROP prediction model and a prediction result in step S4.

In this embodiment, step S5 includes:

Construct a sample point set based on the prediction result obtained by the ROP prediction model in step S4 and the initial sample data set constructed in step S1; and construct a sampling function by selecting a maximum value of the ROP function of each sample point that is calculated by the ROP prediction model, and obtain the ROP optimization model.

In a practical application, the initial sample data set D is taken as a sample point set $D_m$. According to the data calculated by the ROP prediction model, that is, the mean and variance at each sample point in the feasible domain and the maximum value corresponding to the ROP function at each sample point, a sampling function is constructed:

$$u_{EI}(x) = (\mu(x) - f_n^*) - (\mu(x) - f_n^*)\Phi\left(\frac{(\mu(x) - f_n^*)}{\sigma(x)}\right) + \sigma(x)\varphi\left(\frac{(\mu(x) - f_n^*)}{\sigma(x)}\right)$$

where, $u_{EI}(x)$ denotes the sampling function; $\mu(x)$ denotes a mean of the sampling function at searched n sample points; $\sigma(x)$ denotes a variance of the sampling function at the searched n sample points; $f_n^*$ denotes a maximum value of the ROP function at the searched n sample points, which is expressed as: $f_n^* = \max(f(x_1), \ldots, f(x_n))$, $\varphi(\cdot)$ denotes a probability density function of a standard normal distribution (SND); and $\Phi(\cdot)$ denotes a distribution function of the SND.

Figure 4:
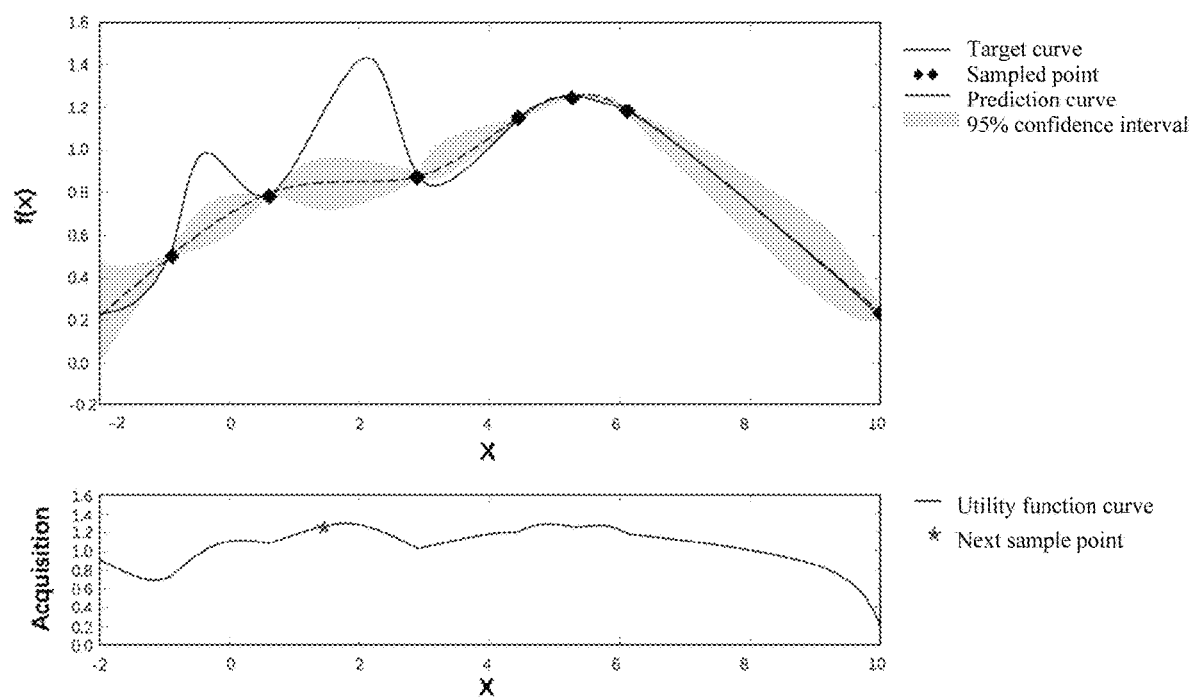
FIG. 4 shows fitting of a sampling function according to the present invention.

In a practical application, the sampling function is an expected improvement (EI) function, which considers the mean and variance of the function value at each point, and considers the optimal function value that has been found in previous iterations. Through the mean, variance and sampling function, the sampling times are significantly reduced, and the next sample point is screened, as shown in FIG. 4.

S6: Obtain an optimized ROP based on the ROP optimization model constructed in step S5.

Figure 5:
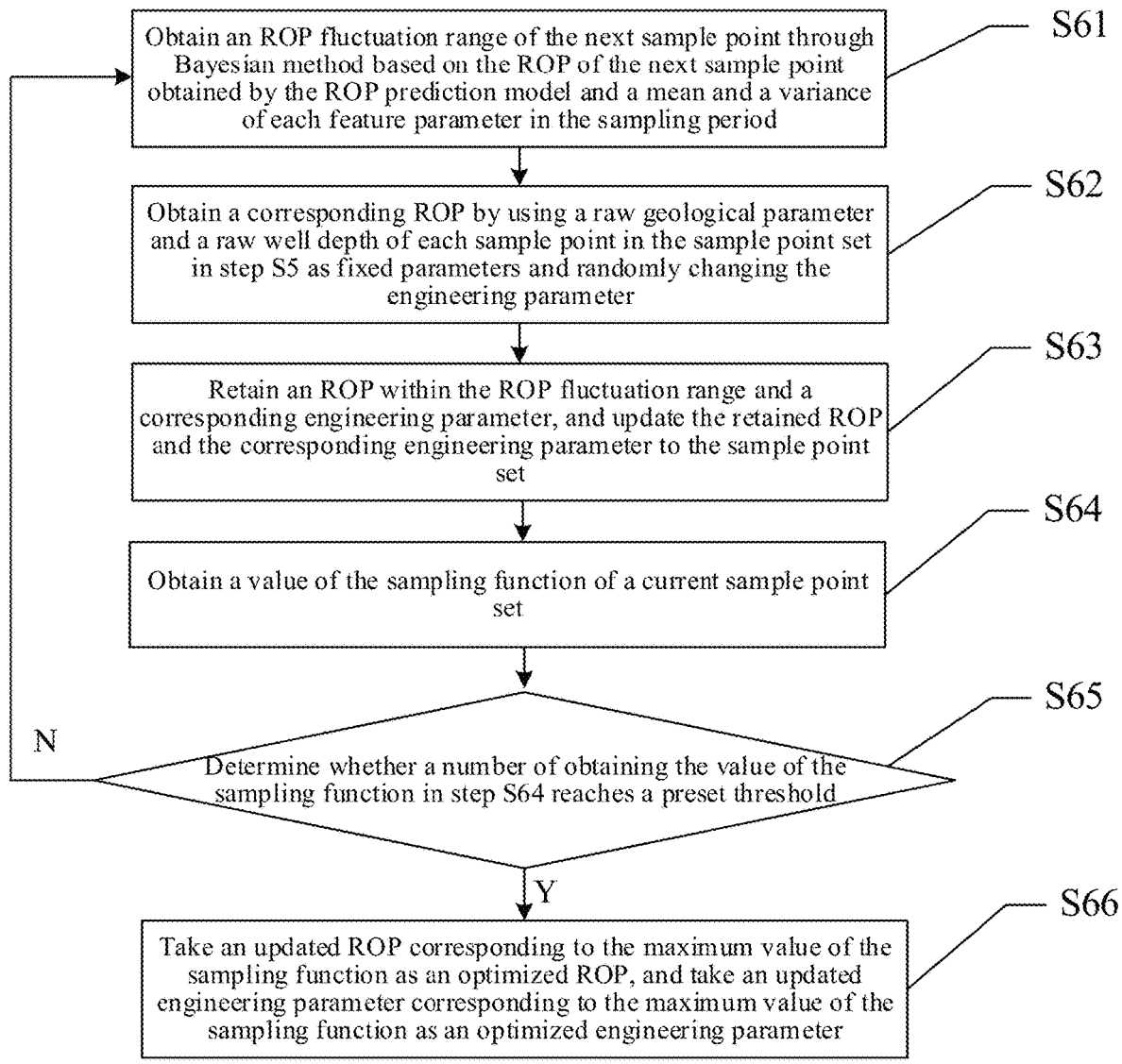
FIG. 5 is a flowchart of step S6 of the prediction method according to the present invention.

As shown in FIG. 5, in this embodiment, Step S6 includes:

S61: Obtain an ROP fluctuation range of the next sample point through Bayesian method based on the ROP of the next sample point obtained by the ROP prediction model and a mean and a variance of each feature parameter in the sampling period.

S62: Obtain a corresponding ROP by using a raw geological parameter and a raw well depth of each sample point in the sample point set in step S5 as fixed parameters and randomly changing the engineering parameter.

In a practical application, during iteration, the raw geological parameter and the well depth are taken as fixed constants, and only the engineering parameter is taken as a variable. The sampling function is calculated in the fluctuation range, and the sampling function value at each sample point is taken as the function value of this point. Taking $x=[3890, a_2, a_3, a_4, a_5, a_6, a_7, 1, a_9, 48.39, 43.843]$ as an example, the well depth is 3890, the lithology category is 1, that is, sandstone, the acoustic travel time difference AC is 48.39, and the natural gamma GR is 43.843. Under the above fixed well depth and geological parameters, $a_2$, $a_3$, $a_4$, $a_5$, $a_6$, $a_7$, $a_9$ denote engineering parameter variables, respectively. The sampling function $u_{Ef}(x)$ is calculated by randomly changing the engineering parameter.

S63: Retain an ROP within the ROP fluctuation range and a corresponding engineering parameter, and update the retained ROP and the corresponding engineering parameter to the sample point set.

In a practical application, the maximum value of the sampling function obtained randomly within the fluctuation range is compared. The next sample point $x_{n+1}$ is determined according to the maximum value of the sampling function, $x_{n+1}=\text{argmax}_x u_{Ef}(x)$. $\text{argmax}_x(\cdot)$ is an extreme value function, which is used to obtain the value of the sample point corresponding to the maximum value of the sampling function, and obtain the next sample point $x_{n+1}$. The retained ROP and the corresponding engineering parameter are updated to the sample point set, which is expressed as: $D_m=\{D_m,x_{n+1}\}$.

S64: Obtain a value of the sampling function of a current sample point set.

S65: Determine whether a number of obtaining the value of the sampling function in step S64 reaches a preset threshold; and if yes, proceed to step S66, otherwise return to step S61 based on the current sample point set.

S66: Take an updated ROP corresponding to the maximum value of the sampling function as the optimized ROP, and take an updated engineering parameter corresponding to the maximum value of the sampling function as an optimized engineering parameter.

In a practical application, the updated ROP of the sample point corresponding to the maximum value of the sampling function is obtained as the optimized ROP, so as to obtain the optimized engineering parameter combination under the fixed well depth and fixed raw geological parameter.

The present invention is described with reference to the flowcharts and/or block diagrams of the method, the device (system), and the computer program product according to the embodiments of the present invention. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing device to generate a machine, so that the instructions executed by a computer or a processor of any other programmable data processing device generate an apparatus for implementing a specific function in one or more processes in the flowcharts and/or in one or more blocks in the block diagrams.

These computer program instructions may also be stored in a computer readable memory that can instruct the computer or any other programmable data processing device to work in a specific manner, so that the instructions stored in the computer readable memory generate an artifact that includes an instruction apparatus. The instruction apparatus implements a specific function in one or more processes in the flowcharts and/or in one or more blocks in the block diagrams.

These computer program instructions may also be loaded onto a computer or another programmable data processing device, so that a series of operations and steps are performed on the computer or another programmable device, thereby generating computer-implemented processing. Therefore, the instructions executed on the computer or another programmable device provide steps for implementing a specific function in one or more processes in the flowcharts and/or in one or more blocks in the block diagrams.

In this specification, specific embodiments are used to describe the principle and implementations of the present invention, and the description of the embodiments is only intended to help understand the method and core idea of the present invention. Meanwhile, a person of ordinary skill in the art may, based on the idea of the present invention, make modifications with respect to the specific implementations and the application scope. Therefore, the content of this specification shall not be construed as a limitation to the present invention.

Those of ordinary skill in the art will understand that the embodiments described herein are intended to help readers understand the principles of the present invention, and it should be understood that the protection scope of the present invention is not limited to such special statements and embodiments. Those of ordinary skill in the art may make other various specific modifications and combinations according to the technical teachings disclosed in the present invention without departing from the essence of the present invention, and such modifications and combinations still fall within the protection scope of the present invention.

What is claimed is:

1. A method for optimizing a rate of penetration of a well drilling operation using a predicted rate of penetration (ROP) for oil and gas drilling based on Bayesian optimization, comprising the following steps:
   S1: while drilling a well, acquiring raw drilling data according to a preset sampling period by using a sensor, wherein the raw drilling data comprises feature parameters of a drilling engineering parameter, a raw formation parameter, and a sequence parameter, the drilling engineering parameter is selected from the group consisting of weight of bit (WOB), rotation speed, torque, drilling fluid density, displacement, riser pressure, drilling tool, and combinations thereof, the raw formation parameter is selected from the group consisting of natural gamma ray (GR), acoustic travel time (AC), lithology, and combinations thereof, and the sequence parameter is the well depth;
   S2: constructing an initial sample data set based on the raw drilling data acquired in step S1;
   S3: constructing an ROP prediction model based on the initial sample data set constructed in step S2;
   S4: predicting an ROP at a next sample point through a Gaussian process regression based on the ROP prediction model constructed in step S3;
   S5: constructing an ROP optimization model based on the ROP prediction model and a prediction result in step S4;
   wherein step S5 comprises:
      constructing a sample point set based on the prediction result obtained by the ROP prediction model in step S4 and the initial sample data set constructed in step S1; and constructing a sampling function by selecting a maximum value of the ROP function of each sample point that is calculated by the ROP prediction model, and obtaining the ROP optimization model; and
   S6: obtaining an optimized ROP based on the ROP optimization model constructed in step S5;

step S6 comprises:
S61: obtaining an ROP fluctuation range of the next sample point through a Bayesian method based on the ROP of the next sample point obtained by the ROP prediction model and a mean and a variance of each feature parameter in the sampling period;
S62: obtaining a corresponding ROP by using the raw formation parameter and raw well depth of each sample point in the sample point set in step S5 as fixed parameters and randomly changing the engineering parameter;
S63: retaining an ROP within the ROP fluctuation range and a corresponding engineering parameter, and updating the retained ROP and the corresponding engineering parameter to the sample point set;
S64: obtaining a value of the sampling function of a current sample point set;
S65: determining whether a number of obtaining the value of the sampling function in step S64 reaches a preset threshold; and if yes, proceeding to step S66, otherwise returning to step S61 based on the current sample point set; and
S66: taking an updated ROP corresponding to the maximum value of the sampling function as the optimized ROP, and taking an updated engineering parameter corresponding to the maximum value of the sampling function as an optimized engineering parameter, changing the engineering parameter of the well drilling operation to the updated engineering parameter so that well drilling continues with the updated engineering parameter to provide the optimized ROP.

2. The method according to claim 1, wherein step S2 comprises:
constructing spatial sequence data being spatially continuous based on well depth acquired in step S1, and obtaining the initial sample data set by taking the engineering parameter and the raw formation parameter features and taking an ROP in the raw drilling data as a data label.

3. The method according to claim 1, wherein step S3 comprises:
S31: calculating a mean vector of each sample point based on the initial sample data set constructed in step S2;
S32: constructing a covariance matrix of each sample point through a Gaussian kernel function based on the initial sample data set constructed in step S2:

$$\sum(x_{1:n}, x_{1:n}) = \begin{pmatrix} cov(x_1, x_1) & \dots & cov(x_1, x_n) \\ \vdots & \square & \vdots \\ cov(x_n, x_1) & \dots & cov(x_n, x_n) \end{pmatrix} = \begin{pmatrix} k(x_1, x_1) & \dots & k(x_1, x_n) \\ \vdots & \square & \vdots \\ k(x_n, x_1) & \dots & k(x_n, x_n) \end{pmatrix}$$

wherein, $\Sigma(x_{1:n},x_{1:n})$ denotes the covariance matrix of each sample point in the initial sample data set; $k(x_n,x_1)$ denotes a Gaussian kernel function of a sample point pair $(x_n,x_1)$ in the initial sample data set; and $cov(x_n,x_1)$ denotes a covariance of the sample point pair $(x_n,x_1)$ in the initial sample data set; and
S33: constructing an ROP function through a Gaussian function based on the mean vector calculated in step S31 and the covariance matrix constructed in step S32, and obtaining the ROP prediction model.

4. The method according to claim 3, wherein the Gaussian kernel function in step S32 is expressed as:

$$k(x_1, x_2) = \alpha_0 \exp\left(-\frac{1}{2\sigma^2}\|x_1 - x_2\|^2\right)$$

wherein, $k(x_1,x_2)$ denotes a Gaussian kernel function of a sample point pair $(x_1,x_2)$ in the initial sample data set; $\alpha_0$ and $\sigma$ are kernel function parameters; and $\|\cdot\|^2$ are 2-norms.

5. The method according to claim 3, wherein the ROP function constructed in step S33 is expressed as:

$$f(x_{1:n}) \sim gp(\mu(x_{1:n}), \Sigma(x_{1:n}, x_{1:n}))$$

wherein, $f(x_{1:n})$ denotes an ROP function in a continuous domain; $\mu(x_{1:n})$ denotes the mean vector of each sample point in the initial sample data set; $\Sigma(x_{1:n},x_{1:n})$ denotes the covariance matrix of each sample point in the initial sample data set; $gp(\cdot)$ denotes the Gaussian function; and $\sim$ denotes mapping.

* * * * *